(12) United States Patent  
Matsuo et al.

(10) Patent No.: US 7,172,955 B2  
(45) Date of Patent: Feb. 6, 2007

(54) SILICON COMPOSITION IN CMOS GATES

(75) Inventors: Kouji Matsuo, Yokohama (JP); Kazuaki Nakajima, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/287,405

(22) Filed: Nov. 28, 2005

(65) Prior Publication Data

US 2006/0081893 A1 Apr. 20, 2006

Related U.S. Application Data

(62) Division of application No. 10/326,113, filed on Dec. 23, 2002, now Pat. No. 6,992,357.

(30) Foreign Application Priority Data

Dec. 27, 2001 (JP) .............................. 2001-398180  
Nov. 27, 2002 (JP) .............................. 2002-344226

(51) Int. Cl.  
*H01L 21/28* (2006.01)  
*H01L 21/44* (2006.01)

(52) U.S. Cl. .................. 438/581; 257/E29.16

(58) Field of Classification Search ................ 438/581, 438/682  
See application file for complete search history.

(56) References Cited

U.S. PATENT DOCUMENTS 6,140,688 A 10/2000 Gardner et al.  
6,171,910 B1 1/2001 Hobbs et al.  
6,376,888 B1 4/2002 Tsunashima et al.  
6,475,908 B1 11/2002 Lin et al.  
6,737,309 B2 5/2004 Matsuo  
2004/0084734 A1 5/2004 Matsuo

FOREIGN PATENT DOCUMENTS

| JP | 08-130216 | 5/1996 |
| JP | 08-153804 | 6/1996 |
| JP | 09-246206 | 9/1997 |
| JP | P2000-252370 A | 9/2000 |
| JP | P2001-284466 A | 10/2001 |

OTHER PUBLICATIONS

Ranade et al., "Work Function Engineering of Molybdenum Gate Electrodes by Nitrogen Implantation" Electrochemical and Solid-State Letters, 4(11) G85-87(2001), Electro-Chemical Society, Aug. 21, 2001.

*Primary Examiner*—W. David Coleman  
(74) *Attorney, Agent, or Firm*—Finnegan, Henderson, Farabow, Garrett & Dunner, L.L.P.

(57) ABSTRACT

A semiconductor device comprises an n-type MIS transistor comprising a first gate insulating film and a first gate electrode including an $MSi_x$ film formed on the first gate insulating film, where M represents a metal element selected from tungsten and molybdenum and x is greater than 1, i.e., x>1; and a p-type MIS transistor comprising a second gate insulating film and a second gate electrode including an $MSi_y$ film formed on the second gate insulating film, where y is not less than 0 and less than 1, i.e., $0 \leq y < 1$.

7 Claims, 7 Drawing Sheets

SILICON COMPOSITION IN CMOS GATES

CROSS-REFERENCE TO RELATED APPLICATIONS

This application is a divisional of application Ser. No. 10/326,113, filed Dec. 23, 2002, now U.S. Pat. No. 6,992,357 which is based upon and claims the benefit of priority from the prior Japanese Patent Applications No. 2001-398180, filed Dec. 27, 2001; and No. 2002-344226, filed Nov. 27, 2002, the entire contents of both of which are incorporated by herein by reference.

BACKGROUND OF THE INVENTION

1. Field of the Invention

The present invention relates to a semiconductor device and a method of manufacturing the same, particularly, to a semiconductor device comprising an n-type MIS transistor and a p-type MIS transistor differing from the n-type MIS transistor in the gate material and a method of manufacturing the same.

2. Description of the Related Art

With progress in the miniaturization of an MOSFET, the gate oxide film (gate insulating film) is being made thinner and thinner. For example, in an MOSFET having a gate length not greater than 50 nm, required is a very thin gate oxide film having a thickness of about 1 nm. It is difficult to form such a thin gate oxide film because, for example, polycrystalline silicon (polysilicon) used for forming the gate electrode is depleted. If polysilicon is not depleted, it is possible to further decrease the thickness of the gate oxide film to about 0.5 nm. Such being the situation, a MOSFET (a MISFET) having a metal gate electrode structure in which a metal free from the depletion phenomenon is used for forming the gate electrode, attracts attentions.

However, a serious problem is generated as follows in the case of using a single kind of a metal for forming the gate electrode. Specifically, an n-type MISFET and a p-type MISFET are rendered equal to each other in the work function of the gate electrode. As a result, it is impossible to make the n-type MISFET and the p-type MISFET different from each other in the work function of the gate electrode, though the n-type MISFET and the p-type MISFET can be made different from each other in the work function of the gate electrode in the case of using a polysilicon gate. It follows that it is very difficult to make the threshold voltage appropriate. Particularly, in order to achieve a low threshold voltage not higher than 0.5 V, it is desirable to use a material having a work function not higher than 4.6 eV, more preferably not higher than 4.3 eV, for forming the gate electrode of the n-type MISFET, and to use a material having a work function not lower than 4.6 eV, more preferably not lower than 4.9 eV, for forming the gate electrode of the p-type MISFET. Under the circumstances, required is a so-called dual metal gate process in which the gate electrode of the n-type MISFET is formed of a metal material differing from that used for forming the gate electrode of the p-type MISFET.

In the dual metal gate process, it is necessary to form the gate electrodes of the n-type MISFET and the p-type MISFET in different processes. Therefore, a first film of a gate electrode material for one of the n-type MISFET and p-type MISFET, e.g., the n-type MISFET, is formed on the entire surface including the region in which both n-type MISFET and p-type MISFET are formed. Then, the first gate electrode material film within the region in which the other MISFET, e.g., the p-type MISFET, is to be formed is selectively removed, followed by forming a second gate electrode material film for the other MISFET, e.g., the p-type MISFET.

Suppose, for example, a hafnium nitride is used as the first gate electrode material for the n-type MISFET, and tungsten is used as the second gate electrode material for the p-type MISFET. In this case, the hafnium nitride layer formed in the p-type MISFET region is removed by a wet etching using, for example, a hydrogen peroxide solution, with a resist used as a mask.

However, in removing the gate electrode material such as hafnium nitride by the wet etching method, the gate insulating film in the region of forming the p-type MISFET is also exposed to the etching solution. In addition, the gate insulating film in the region of forming the p-type MISFET is also exposed to an organic solvent used for removing the resist. It follows that the dual metal gate process described above gives rise to a serious problem that the reliability of the gate insulating film of the p-type MISFET is markedly lowered.

Also, in order to make the n-type MISFET and the p-type MISFET different from each other in the work function of the gate electrode, disclosed is the technology of introducing an impurity into a tungsten silicide film by means of the ion implantation in, for example, Jpn. Pat. Aplln. KOKAI Publication No. 8-130216, Jpn. Pat. Aplln. KOKAI Publication No. 8-153804 and Jpn. Pat. Aplln. KOKAI Publication No. 9-246206. To be more specific, it is disclosed that an n-type impurity is introduced by the ion implantation into the tungsten silicide film of the n-type MISFET, and a p-type impurity is introduced by the ion implantation into the tungsten silicide film of the p-type MISFET so as to make the n-type MISFET and the p-type MISFET different from each other in the work function of the gate electrode.

However, since an impurity is introduced by the ion implantation into the tungsten silicide film, an additional problem is generated that the reliability of, for example, the gate insulating film is lowered because of the damage accompanying the ion implantation.

As described above, proposed is a dual metal gate process in which the gate electrode of the n-type MISFET is formed of a material differing in the work function from the material used for forming the gate electrode of the p-type MISFET. However, the dual metal gate process gives rise to the problem that the gate insulating film is exposed to the etching solution in removing the gate electrode material and to the solution used for removing the resist, with the result that the reliability of the gate insulating film is lowered. Also proposed is the technology that n-type and p-type impurities are introduced by the ion implantation into the silicide films so as to make the n-type MISFET and the p-type MISFET different from each other in the work function of the gate electrode. However, this technology gives rise to the problem that the reliability of, for example, the gate insulating film is lowered because of the damage accompanying the ion implantation. It follows that the characteristics and the reliability of the semiconductor device were likely to be lowered in the prior art.

BRIEF SUMMARY OF THE INVENTION

According to a first aspect of the present invention, there is provided a semiconductor device, comprising: an n-type MIS transistor comprising a first gate insulating film and a first gate electrode including an $MSi_x$ film formed on the first gate insulating film, where M represents a metal element selected from tungsten and molybdenum and x is greater than 1, i.e., x>1; and a p-type MIS transistor comprising a second gate insulating film and a second gate electrode including an $MSi_y$ film formed on the second gate insulating film, where y is not less than 0 and less than 1, i.e., $0 \leq y < 1$.

According to a second aspect of the present invention, there is provided a method of manufacturing a semiconductor device, comprising: forming an $MSi_y$ film, where M represents a metal element selected from tungsten and molybdenum and y is not less than 0 and less than 1, i.e., $0 \leq y < 1$, on a first gate insulating film within a first region in which an n-type MIS transistor is to be formed and on a second gate insulating film within a second region in which a p-type MIS transistor is to be formed; and forming an $MSi_x$ film, where x is greater than 1, i.e., x>1, within the first region by allowing the $MSi_y$ film within the first region to react with silicon.

According to a third aspect of the present invention, there is provided a method of manufacturing a semiconductor device, comprising: forming an $MSi_x$ film, where M represents a metal element selected from tungsten and molybdenum and x is greater than 1, i.e., x>1, on a first gate insulating film within a first region in which an n-type MIS transistor is to be formed and on a second gate insulating film within a second region in which a p-type MIS transistor is to be formed; and forming an $MSi_y$ film, where y is not less than 0 and less than 1, i.e., $0 \leq y < 1$, within the second region by extracting silicon contained in the $MSi_x$ film within the second region.

DETAILED DESCRIPTION OF THE INVENTION

Some embodiments of the present invention will now be described with reference to the accompanying drawings.

Embodiment 1

FIGS. 1A to 1K are cross-sectional views collectively showing a process of manufacturing a MISFET (MIS transistor) according to a first embodiment of the present invention. In this embodiment, a MISFET is manufactured by employing the so-called damascene gate technology.

Figure 1A:
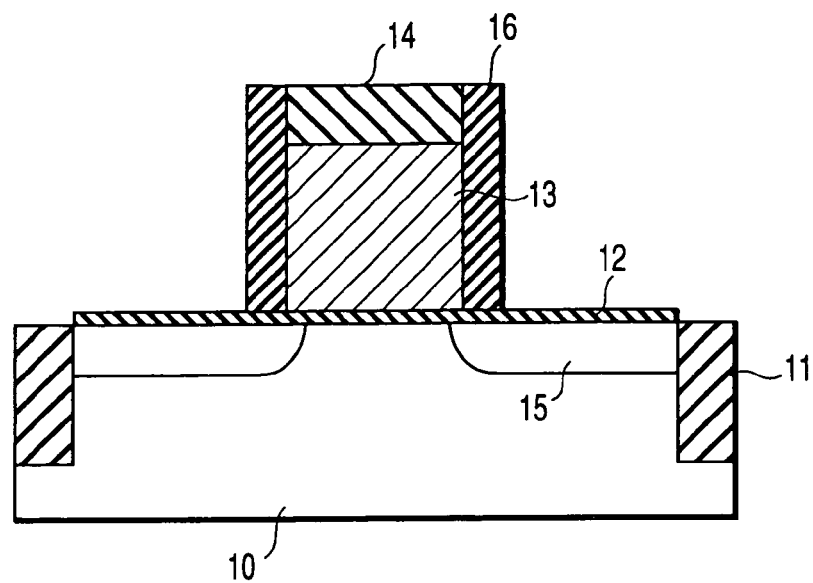
FIGS. 1A to 1K are cross-sectional views collectively showing a process of manufacturing a semiconductor device according to a first embodiment of the present invention.

In the first step, an isolation region 11 is formed in a surface region of a silicon substrate (semiconductor substrate) 10 by using, for example, an STI technology, as shown in FIG. 1A. Then, a stacked structure comprising of a gate oxide film (gate insulating film) 12 having a thickness of about 6 nm, a polysilicon film 13 having a thickness of about 150 nm, and a silicon nitride film 14 having a thickness of about 50 nm is formed as a dummy gate structure that is to be removed later by using an oxidizing technology, a CVD technology, a lithography technology and an RIE technology. Further, an extension diffusion layer 15 is formed by using an ion implantation technology in a surface region of the silicon substrate 10, followed by forming a gate side wall film 16 formed of a silicon nitride film having a width of about 40 nm by using a CVD technology and an RIE technology.

Figure 1B:
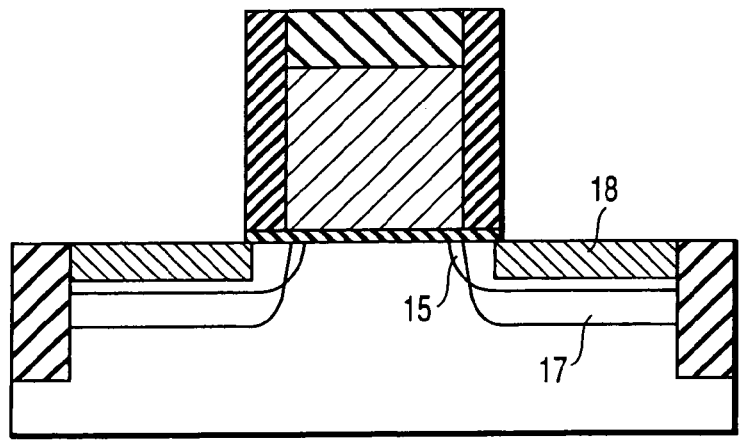

In the next step, source-drain diffusion layers 17 are formed by an ion implantation technology, as shown in FIG. 1B. Then, a silicide film 18, e.g., a cobalt silicide film, is formed in a thickness of about 40 nm only within the source-drain region by a salicide process technology with the dummy gate structure and the gate side wall film 16 used as a mask. In this step, each of arsenic and gallium is introduced as a dopant into the source-drain region by the ion implantation at a dose of at least $1 \times 10^{15}$ /$cm^2$. To be more specific, arsenic and gallium are introduced into the n-type region and the p-type region, respectively. These dopants serve to suppress the agglomeration of the silicide so as to markedly improve the heat resistance.

Figure 1C:
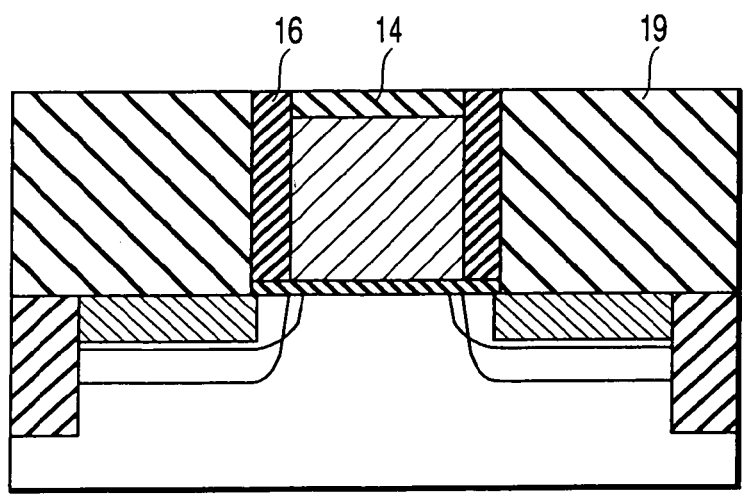

In the next step, an interlayer insulating film 19 formed of, for example, a silicon oxide film is deposited by a CVD method, as shown in FIG. 1C. Then, the silicon oxide film is planarized by the CMP technology so as to expose the upper surfaces of the silicon nitride film 14 and the silicon nitride film 16.

Figure 1D:
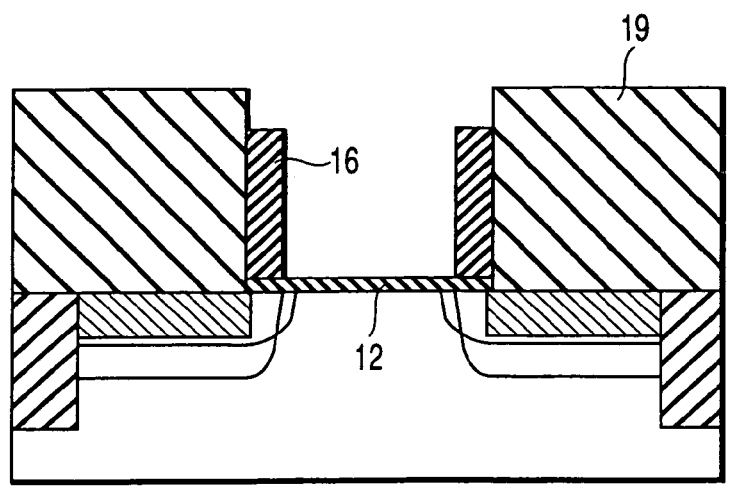

In the next step, the silicon nitride film 14 is selectively removed relative to the interlayer insulating film 19 by using, for example, phosphoric acid, as shown in FIG. 1D. In this step, the silicon nitride film 16 forming the gate side wall film is also etched to about the height of the polysilicon film 13, followed by selectively removing the polysilicon film 13 forming the dummy gate relative to the interlayer insulating film 19 and the gate side wall film 16 by using the radical atomic etching technology.

Figure 1E:
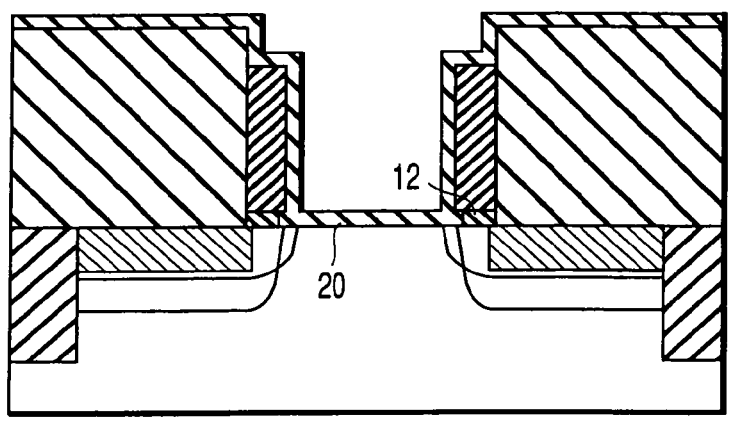

Then, the dummy gate oxide film 12 is removed by a wet processing using, for example, hydrofluoric acid so as to expose the surface of the silicon substrate 10 to the outside, as shown in FIG. 1E, followed by forming a gate insulating film 20 in at least the bottom portion of the groove for the gate thus obtained. A silicon oxide film obtained by thermally oxidizing the silicon substrate 10 can be used as the gate insulating film 20. Alternatively, an insulating film obtained by nitriding the surface of the silicon oxide film by using a nitrogen plasma can be used as the gate insulating film 20. Further, a high dielectric constant film can also be used as the gate insulating film 20 as described in the following.

The high dielectric constant film used as the gate insulating film 20 includes, for example, a hafnium oxide film. The hafnium oxide film can be formed by, for example, forming first a hafnium nitride by a CVD method using $HfCl_4$ and $NH_3$, a CVD method using an organic Hf gas, or a sputtering method using a hafnium nitride target or a hafnium target, followed by oxidizing the hafnium nitride film. It is desirable for the hafnium nitride film that is to be oxidized to be a very thin film having a thickness of about several nanometers because crystallization tends to be brought about with increase in the thickness of the hafnium nitride film. Where the hafnium nitride film is formed by a sputtering method, it is desirable for the hafnium particles or the hafnium nitride particles to have an energy not higher than 100 eV, preferably not higher than 50 eV. It should be noted in this connection that the sputtering particles are caused to bite the silicon substrate with increase in the energy of the sputtering particles so as to deteriorate the morphology of the channel surface.

Figure 1F:
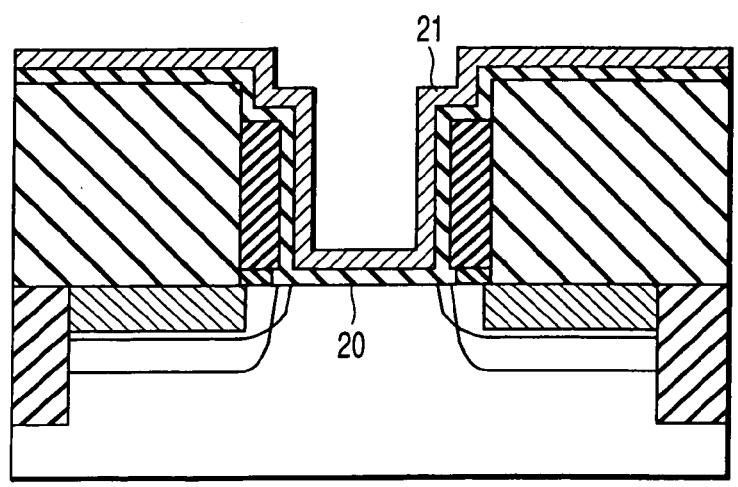
Figure 1G:
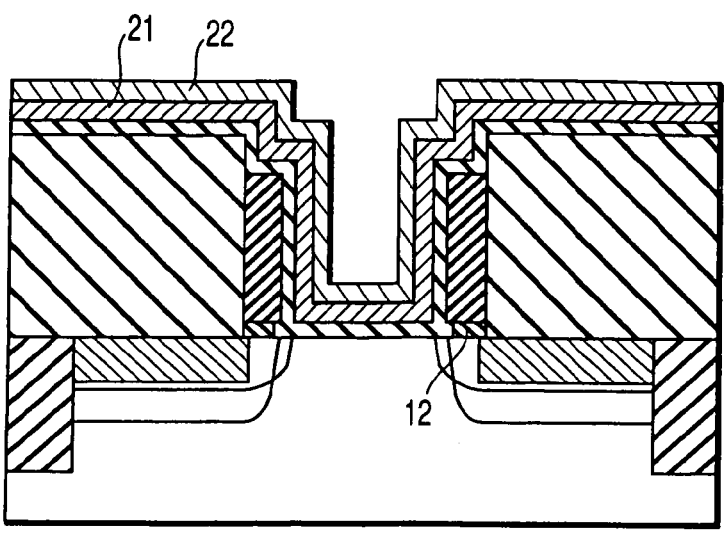

In the next step, a tungsten film (W film) 21 is formed on the entire surface by a sputtering method, a CVD method, or a coating method, as shown in FIG. 1F. It is desirable for the thickness of the tungsten film 21, which is not particularly limited in the present embodiment, to be not greater than about 10 nm for the reasons given later. Also, in the case of employing the sputtering method, it is desirable for the sputtered tungsten particles to have an energy not higher than 100 eV, preferably not higher than 50 eV. Where the sputtered tungsten particles have a low energy, the tungsten particles are prevented from biting the underlying gate insulating film 20 so as to markedly improve the reliability of the gate insulating film.

After formation of the tungsten film 21, a silicon film 22 is formed on the entire surface by a sputtering method, a CVD method or a coating method. The silicon film 22 should be thicker than at least the tungsten film 21. Also, it is desirable for the silicon film 22 to have a thickness not greater than about 30 nm for the reasons described later. It is also desirable to maintain the substrate under vacuum or in an atmosphere having the oxygen content as low as possible without exposing the substrate to the air during the period ranging between the step of forming the tungsten film 21 and the step of forming the silicon film 22, e.g., during the step of transferring the substrate. If oxygen is present between the tungsten film 21 and the silicon film 22, a uniform reaction tends to be impaired in the subsequent silicidation step.

Figure 1H:
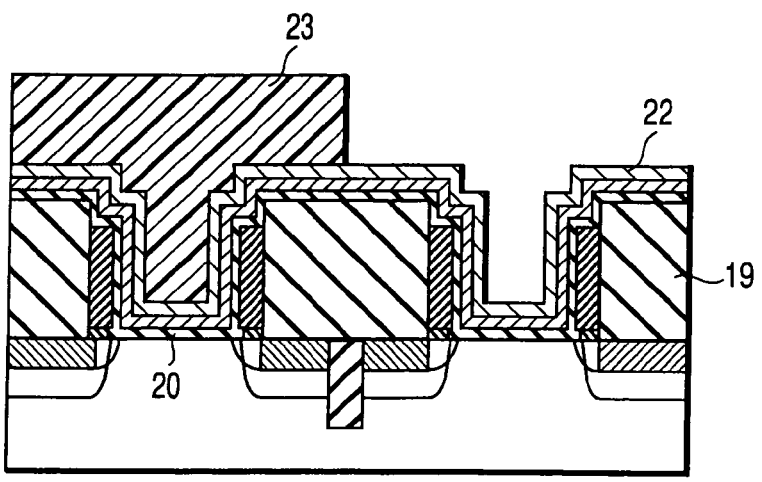

In the next step, the process shown in FIG. 1H is carried out. Incidentally, in FIG. 1H, the left-hand side on the paper constitutes a region for forming an n-type MISFET and the right hand side constitutes a region for forming a p-type MISFET. This is also the case with the subsequent drawings. In the process shown in FIG. 1H, a pattern of resist 23 that is open in the p-type MISFET region alone is formed by the lithography technology.

Figure 1I:
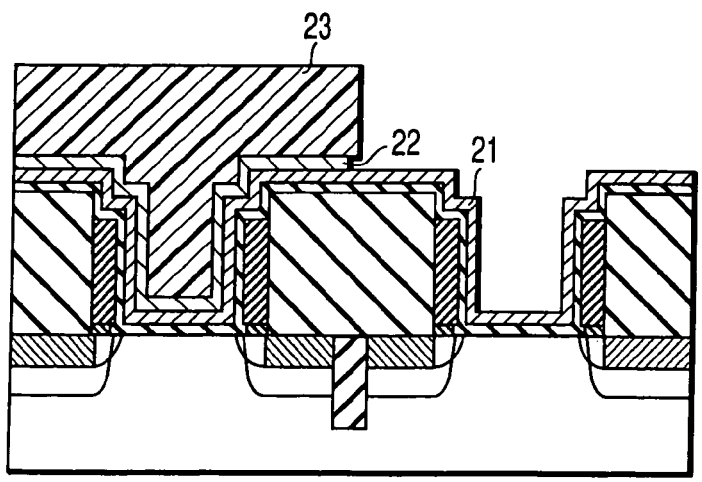

In the next step, the silicon film 22 alone in the p-type MISFET region is selectively removed by applying a dry etching to the silicon film 22 with the resist 23 used as a mask and with the tungsten film 21 used as an etching stopper, as shown in FIG. 1I. In this step, the gate insulating film 20 is not subjected to the dry etching because the gate insulating film 20 is covered with the tungsten film 21.

In the next step, the resist 23 is removed by the treatment with, for example, an organic solvent. In this step, the gate insulating film 20, which is covered with the tungsten film 21, is not exposed to the organic solvent. Then, a heat treatment is applied at a temperature of about 500° C. to 600° C. in, for example, a nitrogen gas atmosphere or a mixed gas atmosphere of a nitrogen gas and a hydrogen gas. By this heat treatment, the tungsten film 21 in the n-type MISFET region reacts with the silicon film 22 so as to form a tungsten silicide film ($WSi_x$ film) 24.

It should be noted that, if the tungsten silicide film 24 formed by the heat treatment noted above is excessively thick, the tungsten silicide film 24 tends to be peeled off by the film stress. Such being the situation, it is desirable to set the thicknesses of the tungsten film 21 and the silicon film 22 such that the tungsten silicide film 24 has desirably a thickness not greater than 20 nm, more desirably a thickness not greater than 10 nm.

It should also be noted that, where an excessive silicon film 22, which is not involved in the reaction during the heat treatment, is present, it is possible to remove selectively the excessive silicon film 22 by, for example, a dry etching treatment. Alternatively, it is also possible to leave the excessive silicon film 22 unremoved as described herein later. On the other hand, the heat treatment temperature and the heat treatment time of the tungsten film 21 and the silicon film 22 are determined to permit the entire tungsten film 21 to be involved in the reaction to form the tungsten silicide film 24 during the heat treatment noted above.

Also, it is desirable for the composition ratio of silicon in the tungsten silicide film ($WSi_x$ film) 24, i.e., the ratio of the number of silicon atoms, to be higher than the composition ratio of tungsten in the tungsten silicide film 24, i.e., the ratio of the number of tungsten atoms. In other words, it is desirable for "x" for $WSi_x$ to be greater than 1, i.e., $x>1$. Particularly, it is desirable for the composition ratio of silicon to be at least twice as high as the composition ratio of tungsten, i.e., $x \geq 2$.

Figure 1J:
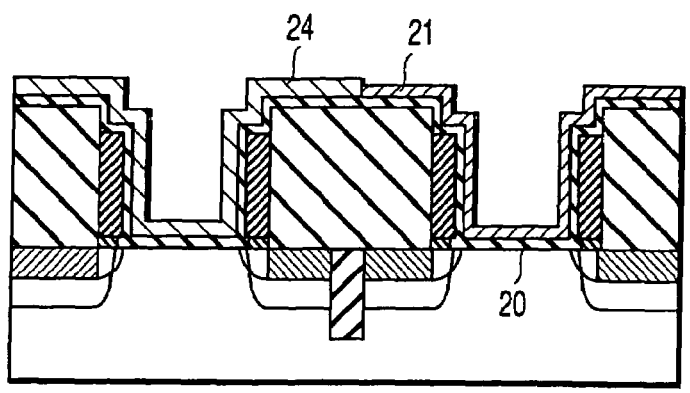
Figure 1K:
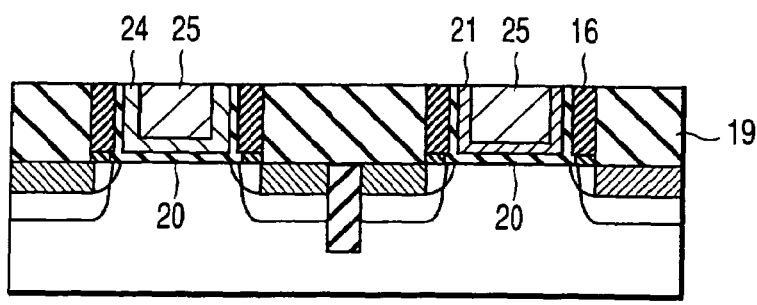

In the next step, a tungsten film 25 is deposited on the entire surface by employing a sputtering method or a CVD method, followed by applying a CMP treatment to the tungsten film 21, the tungsten silicide film 24 and the tungsten film 25, as shown in FIG. 1K. As a result, obtained is a gate electrode structure in which the tungsten silicide film 24 and the tungsten film 25 are buried in the groove for the gate in the n-type MISFET region, and the tungsten film 21 and the tungsten film 25 are buried in the p-type MISFET region.

As described above, obtained is a complementary MISFET (CMISFET) in which the tungsten silicide film 24 constitutes the lowermost layer, which is in contact with the gate insulating film 20, of the gate electrode in the n-type MISFET, and the tungsten film 21 constitutes the lowermost layer, which is in contact with the gate insulating film 20, of the gate electrode in the p-type MISFET.

Figure 2:
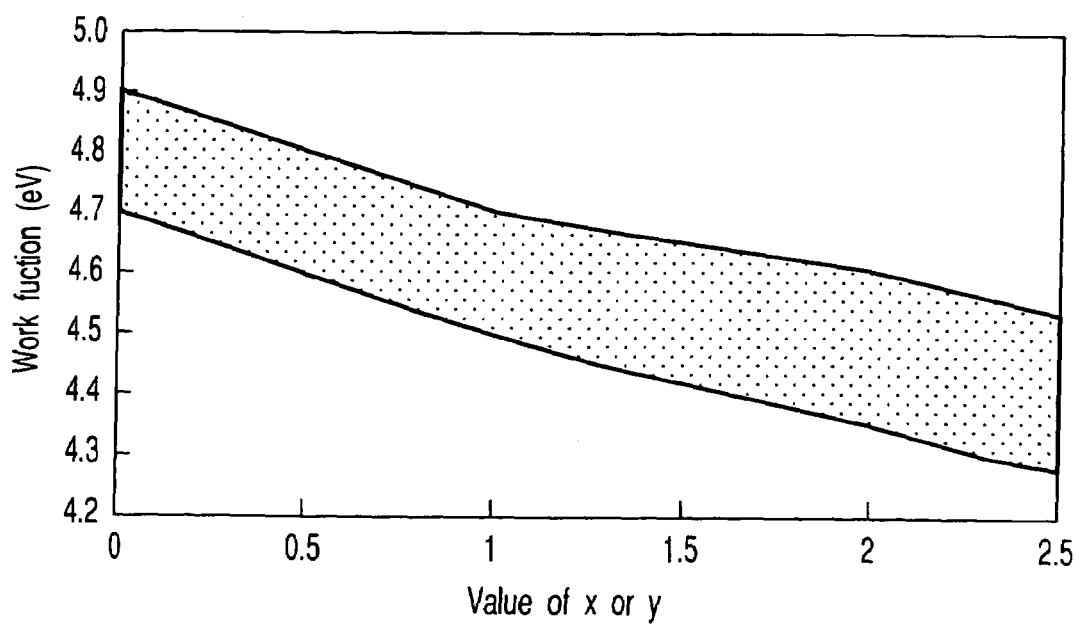
FIG. 2 is a graph showing the relationship between the value of x (or y) in the $WSi_x$ film (or $WSi_y$ film) and the work function.

FIG. 2 is a graph showing the relationship between the value of x (or value of y) of the $WSi_x$ film (or $WSi_y$ film) and the work function. As shown in the graph of FIG. 2, where the value of x of the $WSi_x$ film is zero, i.e., in the case of using a tungsten film (W film), the work function is about 4.7 to 4.9 eV. The work function has a width as shown in FIG. 2 because the work function differs depending on the crystal orientation face.

Where the composition ratio of silicon in the tungsten silicide film ($WSi_x$ film) is greater than the composition ratio of tungsten in the tungsten silicide film, i.e., where x for $WSi_x$ is greater than 1 ($x>1$), the work function of the tungsten silicide film is not higher than about 4.6 eV, though the work function slightly differs depending on the crystal orientation face. As described previously, it is desirable for the work function of the gate electrode included in the n-type MISFET to be not higher than 4.6 eV. It follows that it is possible to obtain a tungsten silicide film adapted for use in forming the gate electrode of the n-type MISFET by setting the value of x for the $WSi_x$ film to a level greater than 1, i.e., $x>1$. It should also be noted that, where the composition ratio of silicon is at least twice as great as the composition ratio of tungsten, i.e., $x \geq 2$, the work function of the tungsten silicide film is rendered not higher than 4.6 eV regardless of the crystal orientation face. It follows that it is possible to obtain a tungsten silicide film adapted for use in forming the gate electrode of the n-type MISFET by setting the value of x for the $WSi_x$ film at a level not less than 2, i.e., $x \geq 2$.

Incidentally, in the embodiment described above, the tungsten film (W film) 21 was used as the lowermost layer of the gate electrode included in the p-type MISFET. Alternatively, it is also possible to use a tungsten silicide film (WSi$_y$ film) in place of the tungsten film 21. In this case, it is possible to use a manufacturing method basically equal to that in the embodiment described above. As described previously, it is desirable for the gate electrode of the p-type MISFET to have a work function not lower than 4.6 eV. As apparent from FIG. 2, it is possible to obtain a tungsten silicide film having a work function not lower than about 4.6 eV and, thus, adapted for use in the gate electrode of the p-type MISFET by setting the value of y for the tungsten silicide film WSi$_y$ to a value less than 1 (y<1). It follows that it is possible to use a tungsten silicide film (0<y<1) in addition to the tungsten film (y=0) in the gate electrode of the p-type MISFET.

As described above, according to the first embodiment of the present invention, it is possible to make the threshold voltage of each of the n-type MISFET and p-type MISFET appropriate by optimizing the work function of the gate electrode included in each of the n-type MISFET and p-type MISFET.

Also, according to the first embodiment of the present invention, the tungsten film is not removed after formation of the tungsten film on the gate insulating film so as to make it possible to overcome the difficulty inherent in the prior art that the surface of the gate insulating film is exposed to the etching solution or an organic solvent. Also, since an impurity is not introduced into the tungsten silicide film by means of an ion implantation as in the prior art, a damage accompanying the ion implantation is not applied to the gate insulating film. It follows that it is possible to manufacture a MISFET with excellent reliability of the gate insulating film.

It should also be noted that tungsten is unlikely to be diffused into the gate insulating film, particularly, silicon oxide film (SiO$_2$ film), and the silicon oxynitride film (SiON film). As a result, it is possible to obtain a MISFET with excellent reliability of the gate insulating film.

Incidentally, the tungsten film 25 on the side of the upper layer, which is formed in the step shown in FIG. 1K, is mainly for lowering the resistance of the gate electrode. Therefore, it is possible to use, for example, aluminum in addition to tungsten as a conductive material having a resistivity lower than that of the tungsten silicide film.

Also, in the manufacturing step shown in FIG. 1K, it is possible to form a barrier metal film such as a titanium nitride film in a thickness of about 5 nm before formation of the tungsten film 25, followed by forming the tungsten film 25.

Also, where the excessive silicon film 22, which was not involved in the reaction during the heat treatment in the manufacturing step shown in FIG. 1J, is not removed, it is possible to carry out the heat treatment after formation of the tungsten film 25 in the manufacturing step shown in FIG. 1K. In this case, the excessive silicon film 22 is allowed to react with the tungsten film 25 during the heat treatment so as to form a tungsten silicide film. Alternatively, it is possible to form the tungsten film 25 after formation of a barrier metal film of a stacked structure including of a titanium film and a titanium nitride film, followed by applying a heat treatment so as to form a titanium silicide film by the reaction between the excessive silicon film 22 and titanium.

Further, in the first embodiment described above, the tungsten film 21 was used as the lowermost layer of the gate electrode included in the p-type MISFET, and the tungsten silicide film 24 was used as the lowermost layer of the gate electrode included in the n-type MISFET. Alternatively, it is also possible to use a molybdenum film as the lowermost layer of the gate electrode included in the p-type MISFET and to use a molybdenum silicide film as the lowermost layer of the gate electrode included in the n-type MISFET. In this case, it is possible to apply the manufacturing step equal or similar to that described above by using a molybdenum film in place of the tungsten film 21 used in the manufacturing step described above. Also, a molybdenum silicide film exhibits the characteristics similar to those shown in FIG. 2. Therefore, it is generally possible to use a MoSi$_x$ film (x>1, more preferably x≧2) in the gate electrode included in the n-type MISFET and a MoSi$_y$ film (0≦y<1) in the gate electrode included in the p-type MISFET.

Embodiment 2

FIGS. 3A to 3I are cross-sectional views collectively showing schematically a manufacturing method of a semiconductor device according to a second embodiment of the present invention.

Figure 3A:
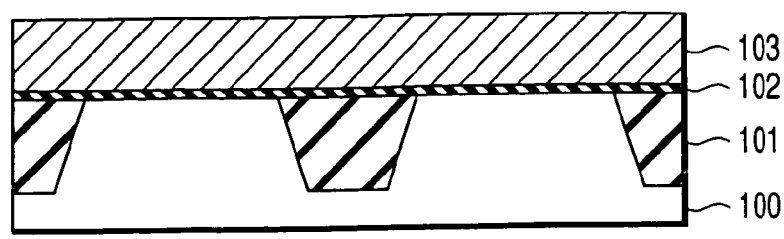
FIGS. 3A to 3I are cross-sectional views collectively showing a process of manufacturing a semiconductor device according to a second embodiment of the present invention.

In the first step, a silicon oxide film 102 is formed on a single crystalline silicon substrate (semiconductor substrate) 100 having an isolating region 101 formed therein in advance, as shown in FIG. 3A. Then, a polycrystalline silicon (polysilicon) film 103 is deposited on the silicon oxide film 102.

Figure 3B:
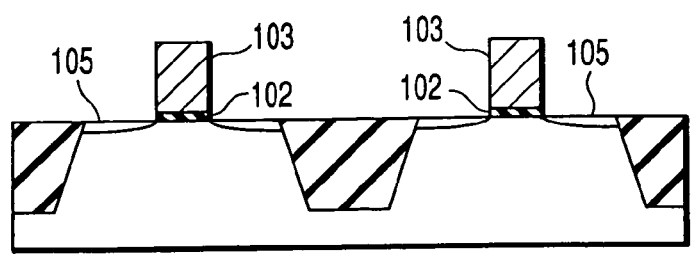

In the next step, a dummy gate electrode is formed by applying an anisotropic etching to the polysilicon film 103, followed by introducing As$^+$ ions into a region (n-MOS region) in which an n-type MISFET is to be formed and B$^+$ ions into a region (p-MOS region) in which a p-type MISFET is to be formed by means of the ion implantation, as shown in FIG. 3B. Further, a heat treatment is applied at 1,000° C. for 5 seconds so as to form a diffusion layer 105 constituting a part of the source-drain region.

Figure 3C:
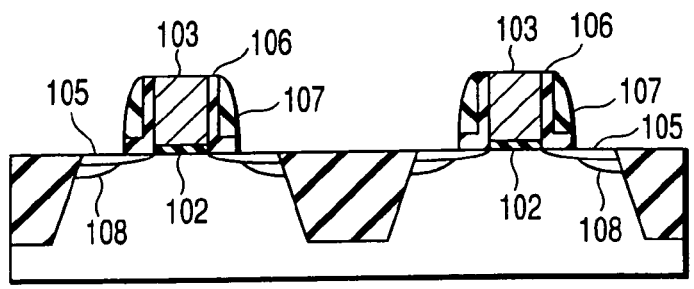

In the next step, a silicon nitride film 106 and a silicon oxide film 107 are deposited on the entire surface, as shown in FIG. 3C, followed by etching back the silicon nitride film 106 and the silicon oxide film 107 so as to permit the silicon nitride film 106 and the silicon oxide film 107 to be left unremoved selectively on the side wall of the dummy gate electrode. Then, P$^+$ ions are introduced into the n-MOS region and B$^+$ ions are introduced into the p-MOS region by means of the ion implantation. Further, a heat treatment is applied at 950° C. for 10 seconds so as to form a diffusion layer 108 constituting a part of the source-drain region.

Figure 3D:
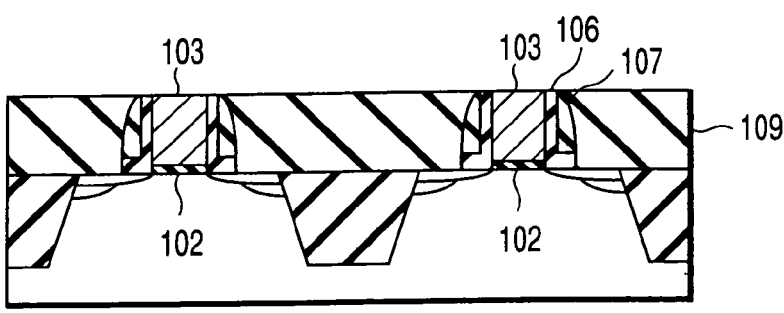

In the next step, an interlayer insulating film 109 is deposited on the entire surface as shown in FIG. 3D. Then, the interlayer insulating film 109 is planarized by a chemical mechanical polishing (CMP) treatment so as to expose the surface of the polysilicon film 103 to the outside.

Figure 3E:
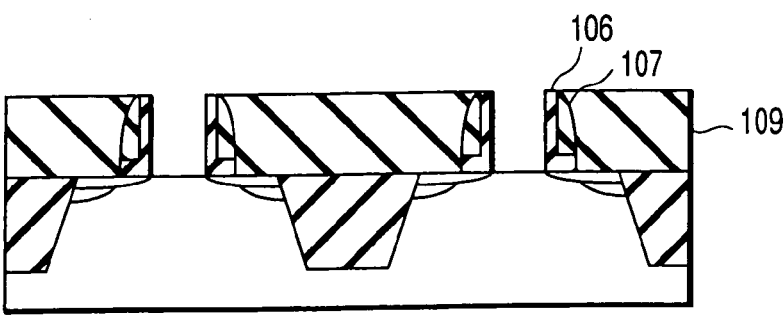

In the next step, the polysilicon film 103 is removed, followed by further removing the silicon oxide film 102, as shown in FIG. 3E. As a result, formed is a groove surrounded by the silicon substrate 100 and the silicon nitride film 106.

Figure 3F:
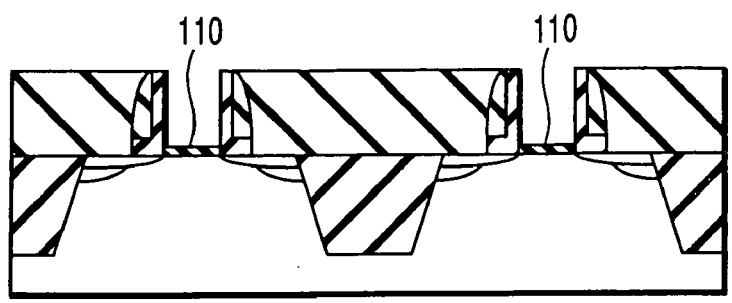

In the next step, a thin silicon oxynitride film is formed as a gate insulating film 110 in the bottom portion of the groove by a plasma oxynitriding method, as shown in FIG. 3F.

Figure 3G:
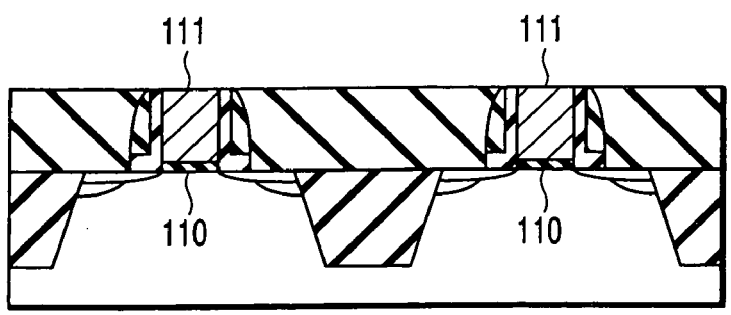

After formation of the gate insulating film 110, a tungsten silicide film (WSi$_x$ film) 111 is deposited on the entire surface by the CVD method, as shown in FIG. 3G. Used in this CVD method are, for example, a W(CO)$_6$ gas and a SiH$_4$ gas as source gases. Further, the tungsten silicide film 111 is planarized by the CMP method so as to expose the surface of the interlayer insulating film 109 to the outside.

Figure 3H:
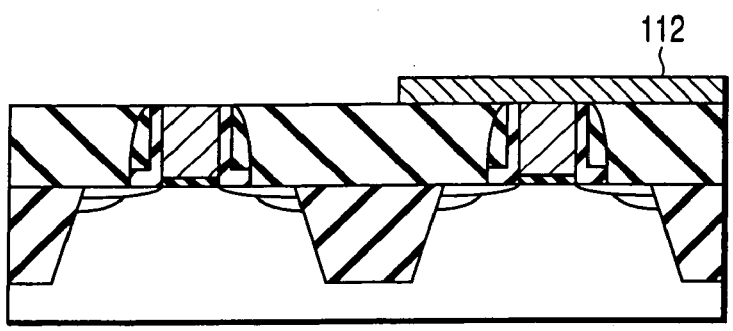

In the next step, a tungsten film (W film) 112 is deposited as a metal film on the entire surface, followed by selectively removing the tungsten film 112 positioned on the region other than the PMOS region, as shown in FIG. 3H.

Figure 3I:
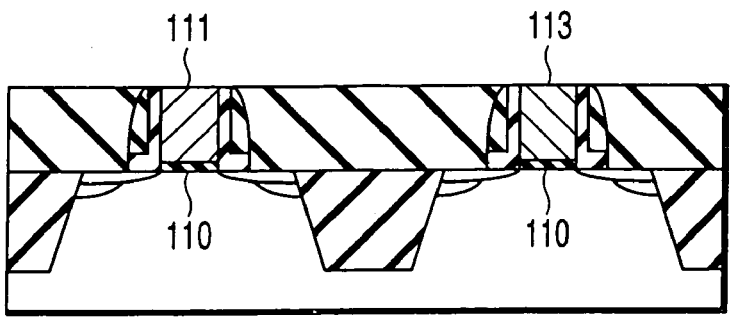

Then, a heat treatment is applied at a temperature of, for example, about 600° C., as shown in FIG. 3I. By this heat treatment, silicon atoms within the tungsten silicide film 111 are extracted on the side of the tungsten film 112. As a result, a tungsten silicide film 113 having a Si concentration lower than that of the tungsten silicide film 111 in the n-MOS region is formed in the p-MOS region. Then, the remaining tungsten film 112 is removed so as to obtain the structure shown in FIG. 3I.

As described above, it is possible to obtain a CMOS transistor in which the tungsten silicide film 111 having a relatively low work function is used in the gate electrode of the n-MOS transistor, and the tungsten silicide film 113 having a relatively high work function is used in the gate electrode of the p-MOS transistor.

Figure 4:
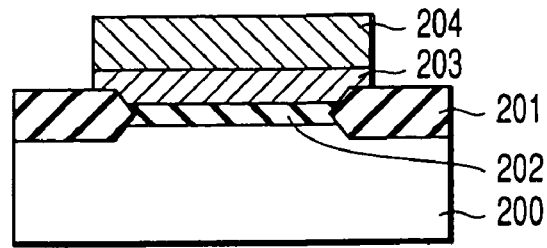
FIG. 4 is a cross-sectional view showing the construction of a MIS capacitor according to the second embodiment of the present invention, which was prepared for examining the effect produced by the heat treatment.

In order to examine the effect of the heat treatment step shown in FIG. 3I, a MIS capacitor as shown in FIG. 4 was prepared as follows. In the first step, a gate insulating film 202 was formed on a single crystalline silicon substrate 200 having an isolating region 201 formed therein in advance. Then, a tungsten silicide film 203 was deposited in a thickness of 10 nm on the gate insulating film 202, followed by depositing a tungsten film 204 in a thickness of 40 nm on the tungsten silicide film 203. Further, the tungsten silicide film 203 and the tungsten film 204 were patterned so as to form a gate electrode. After formation of the gate electrode, a heat treatment was applied in a nitrogen gas atmosphere at temperatures falling within a range of 450° C. to 600° C. so as to allow the tungsten film 204 to extract the silicon atoms contained in the tungsten silicide film 203. Further, a heat treatment was applied at 450° C. in a mixed gas atmosphere consisting of a hydrogen gas and a nitrogen gas, thereby preparing the MIS capacitor shown in FIG. 4.

Figure 5:
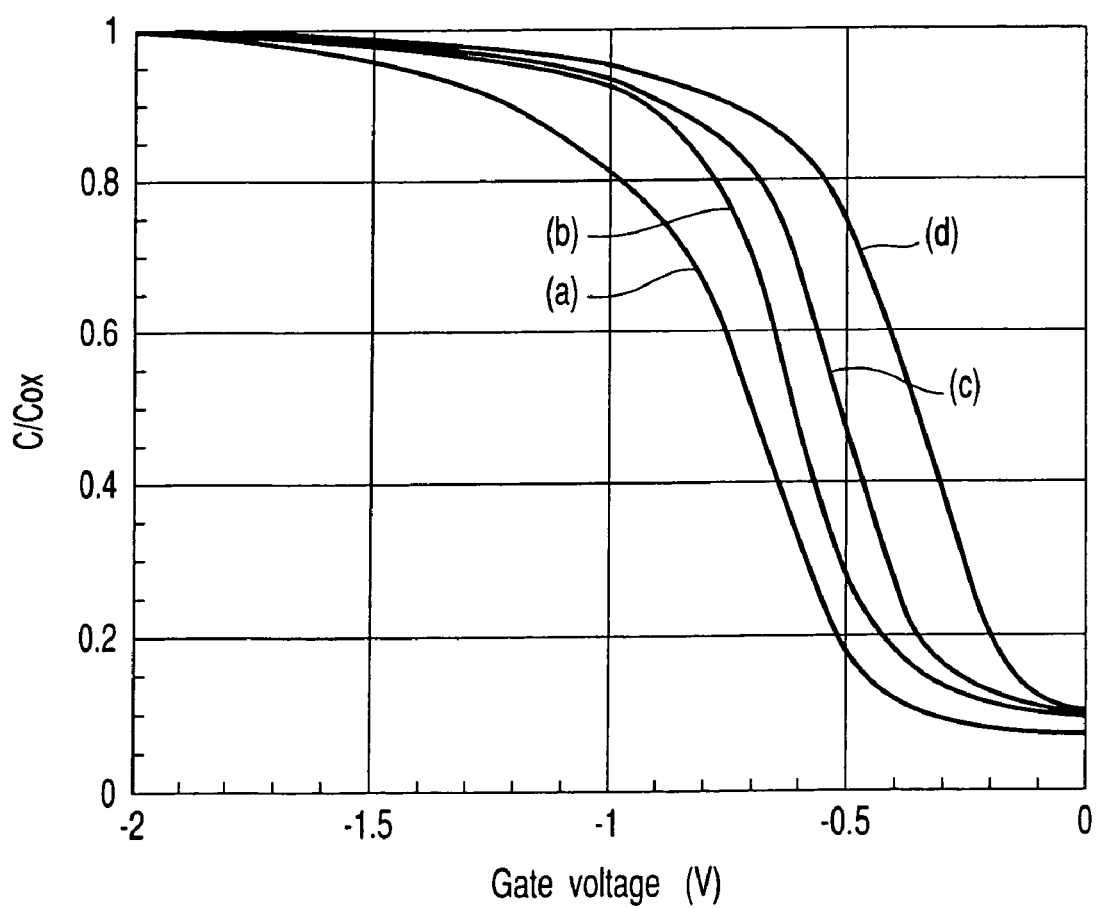
FIG. 5 is a graph showing the C–V characteristics in respect of a MIS capacitor constructed as shown in FIG. 4.

FIG. 5 is a graph showing the C–V characteristics of the MIS capacitor thus prepared. Curves (a), (b), (c) and (d) shown in FIG. 5 cover the cases where the heat treatment temperature was set at 450° C., 500° C., 550° C. and 600° C., respectively. The C–V characteristics were also measured similarly in respect of a MIS capacitor having a single-layer structure of a tungsten silicide film and a MIS capacitor having a single-layer structure of a tungsten film in addition to the MIS capacitor having a stacked structure including the tungsten silicide film 203 and the tungsten film 204.

It has been found that the C–V characteristics of the MIS capacitor having a stacked structure, to which a heat treatment was applied at 450° C., are equal to the C–V characteristics of the MIS capacitor having a single-layer structure of a tungsten silicide film. It has also been found that the C–V characteristics are shifted to the right in the graph with an increase in the heat treatment temperature from 500° C. to 550° C. and, then, to 600° C., with the result that the C–V characteristics in the case where the heat treatment temperature is set at 600° C. are equal to the C–V characteristics of the MIS capacitor having a single-layer structure of a tungsten film. The shifting amount of the C–V characteristics in the graph is proportional to the work function of the electrode material. To be more specific, the shifting amount of the C–V characteristics in the graph increases with an increase in the work function of the electrode material. It follows that the amount of the silicon atoms migrated from the tungsten silicide film into the tungsten film is increased with elevation in the heat treatment temperature. Where the heat treatment is carried out at the temperature of about 600° C., it is considered reasonable to understand that the tungsten silicide film is put in a state very close to the tungsten film at least in the vicinity of the interface between the tungsten silicide film and the gate insulating film.

Incidentally, the relationship in the second embodiment of the present invention between the value of x or the value of y in the tungsten silicide film $WSi_x$ or $WSi_y$, and the work function is equal to that shown in FIG. 2 in conjunction with the first embodiment of the present invention. It follows that, in the tungsten silicide film ($WSi_x$ film) included in the n-type MISFET, the value of x should be greater than 1, i.e., x>1, preferably should be not less than 2, i.e., $x \geq 2$. In other words, the value of x for the tungsten silicide film ($WSi_x$ film) 111 should be greater than 1, i.e., x>1, preferably should be not less than 2, i.e., $x \geq 2$. Also, the value of y for the tungsten silicide film ($WSi_y$ film) included in the p-type MISFET should be less than 1, i.e., y<1. In other words, the value of y for the tungsten silicide film ($WSi_y$ film) 113 should be less than 1, i.e., y<1. Also, as apparent from FIGS. 4 and 5, it is possible for the tungsten silicide film 111 to be converted substantially into a tungsten film. It follows that it is possible to use a tungsten film (W film in which the value of y is 0) in place of the tungsten silicide film 113 ($WSi_y$ film in which the value of y falls within the range of 0 to 1, i.e., 0<y<1) in the p-type MISFET.

As described above, in the second embodiment of the present invention, it is possible to make the threshold voltage of each of the n-type MISFET and the p-type MISFET appropriate by optimizing the work function of the gate electrode included in each of the n-type MISFET and the p-type MISFET.

Also, according to the second embodiment of the present invention, the tungsten silicide film formed on the gate insulating film is not removed in the subsequent step so as to overcome the difficulty inherent in the prior art that the surface of the gate insulating film is exposed to the wet etching solution or an organic solvent. What should also be noted is that, in the second embodiment of the present invention, an impurity is not introduced into the tungsten silicide film by means of the ion implantation, though an impurity is introduced into the tungsten silicide film by means of the ion implantation in the prior art. It follows that a damage accompanying the ion implantation is not applied to the gate insulating film in the second embodiment of the present invention so as to make it possible to manufacture a MISFET with excellent reliability of the gate insulating film.

Incidentally, in the second embodiment of the present invention, a $W(CO)_6$ gas and a $SiH_4$ gas were used as the source gases for forming the tungsten silicide film 111. Alternatively, it is also possible to use a $WF_6$ gas or a $WCl_6$ gas as the source gas of W and a $SiH_2Cl_2$ gas, a $SiCl_4$ gas or a $SiF_4$ gas as the source gas of Si.

Also, in the second embodiment of the present invention, it is possible to allow the tungsten silicide film 111 to contain phosphorus (P) or arsenic (As). Where it is intended to allow the tungsten silicide film 111 to contain phosphorus (P), it is possible to use, for example, a $PH_3$ gas as the source gas of P. Where it is intended to allow the tungsten silicide film 111 to contain arsenic (As), it is possible to use, for example, a $AsH_3$ gas as the source gas of As. The work function of the tungsten silicide film can be reduced by allowing the tungsten silicide film to contain an impurity such as P or As, compared with the tungsten silicide film that does not contain the impurity.

Also, in the second embodiment of the present invention, a reaction is carried out between the tungsten silicide film 111 and the tungsten film (metal film) 112. Alternatively, it is also possible to use a metal film containing at least one element selected from Pt, Pd, Ni, Co, W, Mo, Sb and Bi in place of the tungsten film 112.

Further, in the second embodiment of the present invention, the tungsten silicide film 111 was used in the gate electrode of the n-type MISFET, and the tungsten silicide film 113 was used in the gate electrode of the p-type MISFET. Alternatively, it is also possible to use a molybdenum silicide film in place of each of these tungsten silicide films. In this case, it is possible to apply the process equal or similar to that described above by using a molybdenum silicide film in place of the tungsten silicide film 111 used in the manufacturing process described above. It is possible to use a $Mo(CO)_6$ gas, a $MoF_6$ gas, or a $MoCl_6$ gas as the source gas of Mo. On the other hand, it is possible to use a $SiH_4$ gas, a $SiH_2Cl_2$ gas, a $SiCl_4$ gas or a $SiF_4$ gas as the source gas of Si. The molybdenum silicide film exhibits the characteristics similar to those shown in FIG. 2. Therefore, it is generally possible to use a $MoSi_x$ film, where x is greater than 1, i.e., x>1, preferably x is not less than 2, i.e., $x \geq 2$, in the gate electrode of the n-type MISFET, and to use a $MoSi_y$ film, where y is not less than 0 and less than 1, i.e., $0 \leq y < 1$, in the gate electrode of the p-type MISFET.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming an $MSi_y$ film, where M represents a metal element selected from tungsten and molybdenum and y is not less than 0 and less than 1, i.e., $0 \leq y < 1$, on a first gate insulating film within a first region in which an n-type MIS transistor is to be formed and on a second gate insulating film within a second region in which a p-type MIS transistor is to be formed; and forming an $MSi_x$ film, where x is greater than 1, i.e., x>1, within the first region by allowing the $MSi_y$ film within the first region to react with silicon.

2. The method according to claim 1, wherein forming the $MSi_x$ film comprises forming a silicon film on the $MSi_y$ film within the first region, and allowing the $MSi_y$ film within the first region to react with the silicon film by applying a heat treatment.

3. The method according to claim 1, further comprising forming on the $MSi_x$ film a conductive film having a resistivity lower than that of the $MSi_x$ film.

4. The method according to claim 1, wherein the value of x is not less than 2, i.e., $x \geq 2$.

5. A method of manufacturing a semiconductor device, comprising:

forming an $MSi_x$ film, where M represents a metal element selected from tungsten and molybdenum and x is greater than 1, i.e., x>1, on a first gate insulating film within a first region in which an n-type MIS transistor is to be formed and on a second gate insulating film within a second region in which a p-type MIS transistor is to be formed; and forming an $MSi_y$ film, where y is not less than 0 and less than 1, i.e., $0 \leq y < 1$, within the second region by extracting silicon contained in the $MSi_x$ film within the second region.

6. The method according to claim 5, wherein forming the $MSi_y$ film comprises forming a metal film on the $MSi_x$ film within the second region, and allowing the metal film to react with silicon contained in the $MSi_x$ film within the second region by applying a heat treatment.

7. The method according to claim 5, wherein the value of x is not less than 2, i.e., $x \geq 2$.

* * * * *